US012672326B2

(12) United States Patent
Huang et al.

(10) Patent No.: US 12,672,326 B2
(45) Date of Patent: Jun. 30, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Yu-Shiang Huang, Hsinchu City (TW); Yen-Ting Chen, Taichung (TW); Wei-Yang Lee, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 369 days.

(21) Appl. No.: 18/452,072

(22) Filed: Aug. 18, 2023

(65) Prior Publication Data

US 2025/0063781 A1    Feb. 20, 2025

(51) Int. Cl.
| | |
|---|---|
| *H10D 62/10* | (2025.01) |
| *H10D 30/01* | (2025.01) |
| *H10D 30/43* | (2025.01) |
| *H10D 30/67* | (2025.01) |
| *H10D 62/13* | (2025.01) |

(Continued)

(52) U.S. Cl.
CPC ......... *H10D 62/122* (2025.01); *H10D 30/014* (2025.01); *H10D 30/43* (2025.01); *H10D 30/6735* (2025.01); *H10D 30/6757* (2025.01); *H10D 62/151* (2025.01); *H10D 64/017* (2025.01); *H10D 64/018* (2025.01); *H10D 84/013* (2025.01); *H10D 84/0135* (2025.01);

*H10D 84/0147* (2025.01); *H10D 84/038* (2025.01); *H10D 84/83* (2025.01)

(58) Field of Classification Search
CPC .... H10D 62/122; H10D 30/014; H10D 30/43; H10D 30/6735; H10D 30/6757; H10D 62/151; H10D 64/017; H10D 64/018; H10D 84/013; H10D 84/0135; H10D 84/0147; H10D 84/038; H10D 84/83; H10D 30/507; H10D 30/0196
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |

(Continued)

FOREIGN PATENT DOCUMENTS

| | | |
|---|---|---|
| TW | 202215601 A | 4/2022 |
| TW | 202245255 A | 11/2022 |

(Continued)

*Primary Examiner* — S M Sohel Imtiaz
(74) *Attorney, Agent, or Firm* — Birch, Stewart, Kolasch & Birch, LLP

(57) ABSTRACT

Semiconductor structures and methods for forming the same are provided. The semiconductor structure includes a plurality of nanostructures formed over a substrate, and an inner spacer layer between two adjacent nanostructures. The semiconductor structure includes a source/drain (S/D) structure formed adjacent to the inner spacer layer, and a barrier layer adjacent to the inner spacer layer. The barrier layer extends from the first position to the second position, and the first position is between the inner spacer layer and the nanostructure, and the second position is between the nanostructures and the S/D structure.

20 Claims, 15 Drawing Sheets

100a 158  152

(51) Int. Cl.

| | |
|---|---|
| *H10D 64/01* | (2025.01) |
| *H10D 84/01* | (2025.01) |
| *H10D 84/03* | (2025.01) |
| *H10D 84/83* | (2025.01) |

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2020/0051981 A1* | 2/2020 | Yang | H10D 30/6757 |
| 2020/0287020 A1* | 9/2020 | Seo | H10D 86/011 |
| 2021/0057544 A1* | 2/2021 | Lin | H10D 84/85 |
| 2021/0098632 A1* | 4/2021 | Duriez | H10D 30/43 |
| 2022/0139914 A1* | 5/2022 | Cheng | H10D 30/6735 257/288 |
| 2022/0310456 A1* | 9/2022 | Hall | H10D 30/6735 |
| 2023/0029232 A1* | 1/2023 | Cheng | H10D 62/121 |
| 2023/0041159 A1* | 2/2023 | Zhang | H10D 64/017 |
| 2023/0052084 A1 | 2/2023 | Cheng et al. | |
| 2023/0085033 A1* | 3/2023 | Xie | H10D 62/118 257/321 |
| 2023/0131388 A1 | 4/2023 | Cheng et al. | |
| 2023/0290862 A1* | 9/2023 | Hall | H10D 30/6757 |
| 2024/0038842 A1* | 2/2024 | Chun | H10D 30/43 |
| 2024/0395887 A1* | 11/2024 | Hong | H10D 64/017 |

FOREIGN PATENT DOCUMENTS

| | | |
|---|---|---|
| TW | 202315837 A | 4/2023 |
| TW | 202316500 A | 4/2023 |
| TW | 202316502 A | 4/2023 |

* cited by examiner

100a

100b

100c

108'

142

144  148  146  134

136

132

136

108'

100d

108'

142

144  148  146  134

136

130

132

136

108'

SEMICONDUCTOR STRUCTURE AND METHOD FOR FORMING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
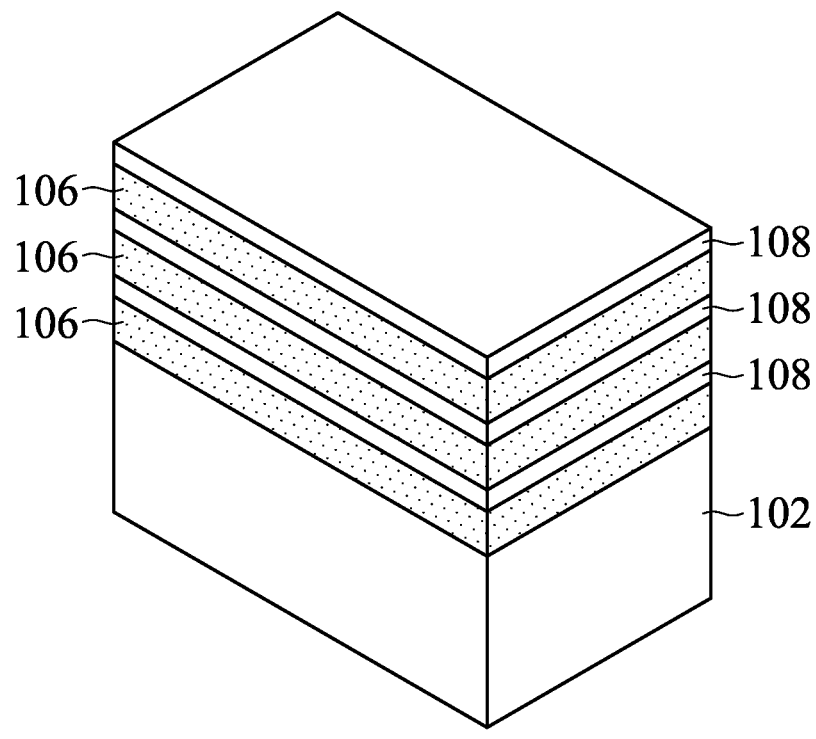
FIGS. 1A to 1E illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The nanostructures are formed on a substrate, and a gate structure wraps around the nanostructures. An S/D structure adjacent to the gate structure, and an inner spacer layer between the gate structure and the S/D structure. A barrier layer is formed between the inner spacer layer and the S/D structure to acts as a stop layer. The barrier layer is used to prevent or reduce the diffusion of the dopant of the S/D structure and prevent the damage of the S/D structure during the nanostructures (or channel layer) formation process. In addition, the barrier layer can be part of the nanostructures (or channel layer). Since the unwanted diffusion issue and the damage of the S/D structures are reduced, the gate control of the semiconductor structure is improved. Therefore, the performance of the semiconductor structure may be improved. The source/drain (S/D) structure or region(s) may refer to a source or a drain, individually or collectively dependent upon the context.

FIGS. 1A to 1E illustrate perspective views of intermediate stages of manufacturing a semiconductor structure 100a in accordance with some embodiments. As shown in FIG. 1A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
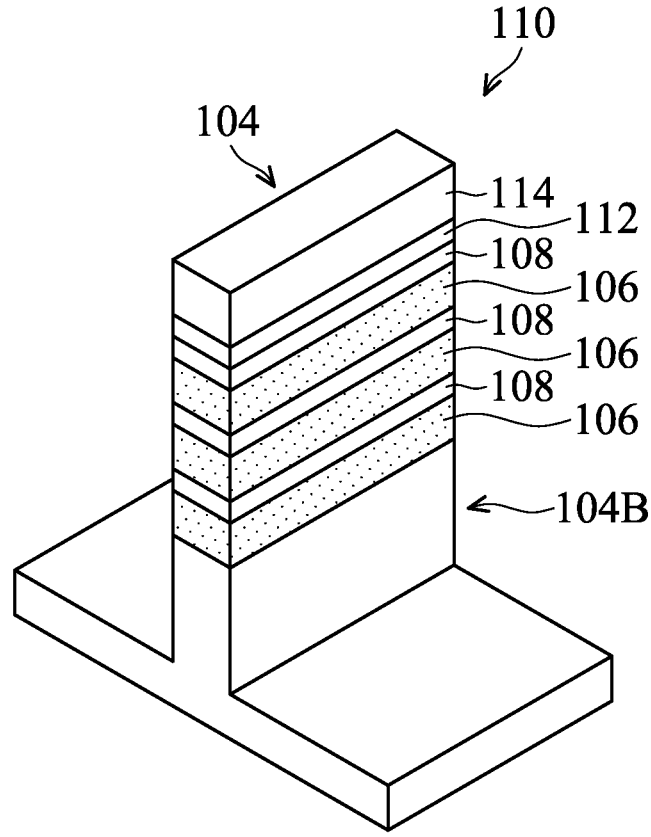

As shown in FIG. 1B, after the first semiconductor material layers 106 and the second semiconductor material layers 108 are formed as a semiconductor material stack over the substrate 102, the semiconductor material stack is patterned to form a fin structure 104, in accordance with some embodiments. In some embodiments, the fin structure 104 includes a base fin structure 104B and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 112 and a nitride layer 114 formed over the pad oxide layer 112. The pad oxide layer 112 may be made of silicon oxide, which is formed by thermal oxidation or chemical vapor deposition (CVD), and the nitride layer 114 may be made of silicon nitride, which is formed by chemical vapor deposition (CVD), such as low-temperature chemical vapor deposition (LPCVD) or plasma-enhanced CVD (PECVD).

Figure 1C:
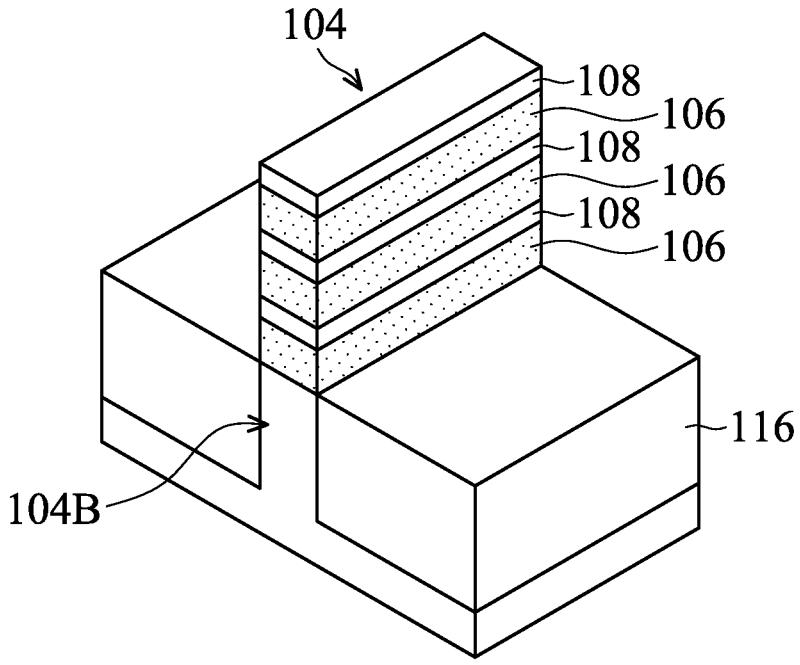

As shown in FIG. 1C, after the fin structure 104 is formed, an isolation structure 116 is formed around the fin structure 104, and the mask structure 110 is removed, in accordance with some embodiments. The isolation structure 116 is configured to electrically isolate active regions (e.g. the fin structure 104) of the semiconductor structure 100a and is also referred to as shallow trench isolation (STI) feature in accordance with some embodiments.

The isolation structure 116 may be formed by depositing an insulating layer over the substrate 102 and recessing the insulating layer so that the fin structure 104 is protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1D:
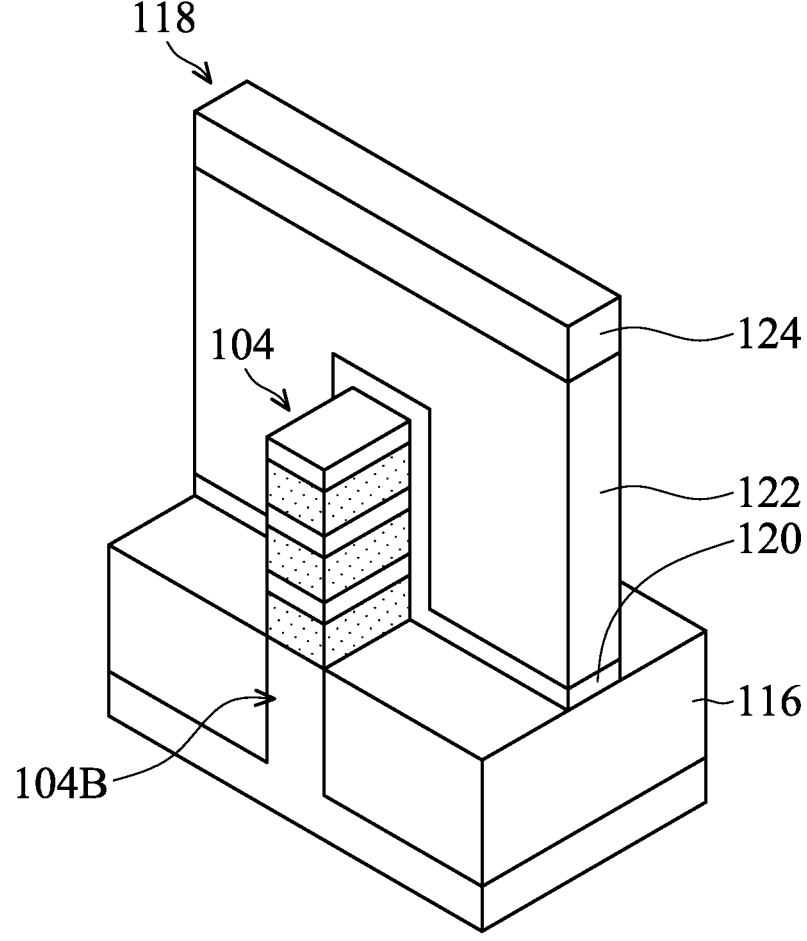

As shown in FIG. 1D, after the isolation structure 116 is formed, a dummy gate structure 118 is formed across the fin structure 104 and extends over the isolation structure 116, in accordance with some embodiments. The dummy gate structure 118 may be used to define the source/drain regions and the channel regions of the resulting semiconductor structure 100a.

In some embodiments, the dummy gate structure 118 includes a dummy gate dielectric layer 120 and a dummy gate electrode layer 122. In some embodiments, the dummy gate dielectric layer 120 is made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layer 120 is formed using thermal oxidation, chemical vapor deposition (CVD), atomic vapor deposition (ALD), physical vapor deposition (PVD), another suitable method, or a combination thereof.

In some embodiments, the dummy gate electrode layer 122 is made of conductive material. In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layer 122 is formed using chemical vapor deposition (CVD), physical vapor deposition (PVD), or a combination thereof.

In some embodiments, a hard mask layer 124 is formed over the dummy gate structure 118. In some embodiments, the hard mask layer 124 includes multiple layers, such as an oxide layer and a nitride layer. In some embodiments, the oxide layer is silicon oxide, and the nitride layer is silicon nitride.

The formation of the dummy gate structure 118 may include conformally forming a dielectric material as the dummy gate dielectric layer 120. Afterwards, a conductive material may be formed over the dielectric material as the dummy gate electrode layer 122, and the hard mask layer 124 may be formed over the conductive material. Next, the dielectric material and the conductive material may be patterned through the hard mask layer 124 to form the dummy gate structure 118.

Figure 1E:
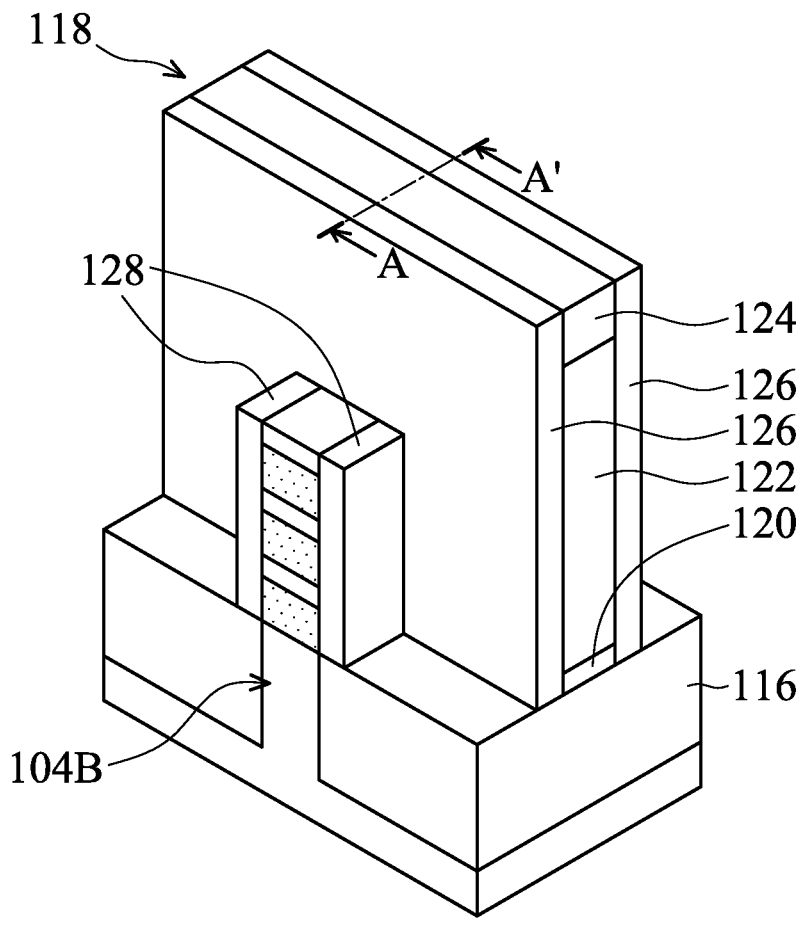

As shown in FIG. 1E, after the dummy gate structure 118 is formed, gate spacers 126 are formed along and covering opposite sidewalls of the dummy gate structure 118 and fin spacers 128 are formed along and covering opposite side-walls of the source/drain regions of the fin structure 104, in accordance with some embodiments.

The gate spacers 126 may be configured to separate source/drain structures from the dummy gate structure 118 and support the dummy gate structure 118, and the fin spacers 128 may be configured to constrain a lateral growth of subsequently formed source/drain structure and support the fin structure 104.

In some embodiments, the gate spacers 126 and the fin spacers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacers 126 and the fin spacers 128 may include conformally depositing a dielectric material covering the dummy gate structure 118, the fin structure 104, and the isolation structure 116 over the substrate 102, and performing an anisotropic etching process, such as dry plasma etching, to remove the dielectric layer covering the top surfaces of the dummy gate structure 118, the fin structure 104, and portions of the isolation structure 116.

FIGS. 2A to 2K illustrate cross-sectional representations of various stages of manufacturing the semiconductor structure 100a shown along line A-A' in FIG. 1E in accordance with some embodiments.

Figure 2B:
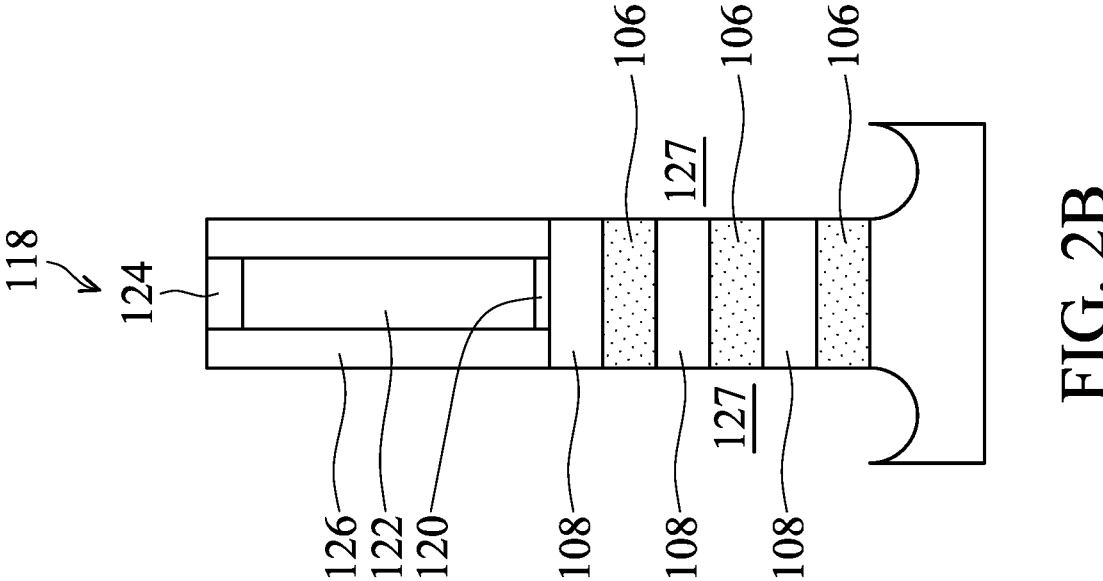
FIGS. 2A to 2K illustrate cross-sectional representations of various stages of manufacturing the semiconductor structure shown along line A-A' in FIG. 1E in accordance with some embodiments.
Figure 2A:
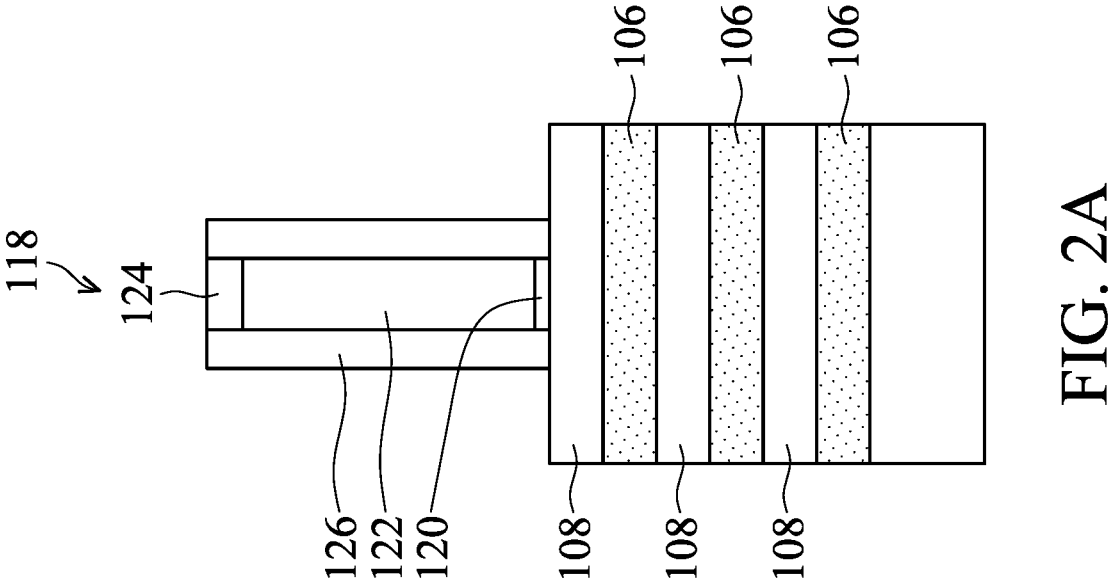

As shown in FIG. 2A, the gate spacer layers 126 are formed on opposite sidewall surfaces of the dummy gate structure 118.

Next, as shown in FIG. 2B, after the gate spacer layers 126 are formed, the source/drain (S/D) regions of the fin structure 104 are recessed to form source/drain (S/D) recesses 127, as shown in in accordance with some embodiments. More specifically, the first semiconductor material layers 106 and the second semiconductor material layers 108 not covered by the dummy gate structure 118 and the gate spacer layers 126 are removed in accordance with some embodiments.

In some embodiments, the fin structure 104 is recessed by performing an etching process. The etching process may be an anisotropic etching process, such as dry plasma etching, and the dummy gate structure 118 and the gate spacer layers 126 are used as etching masks during the etching process.

Figure 2D:
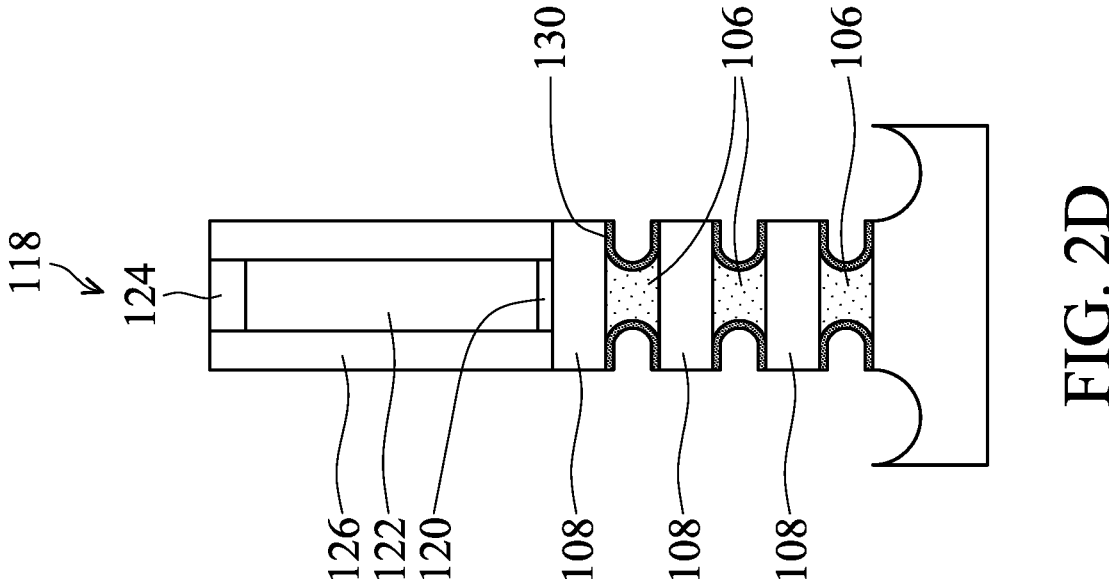
Figure 2C:
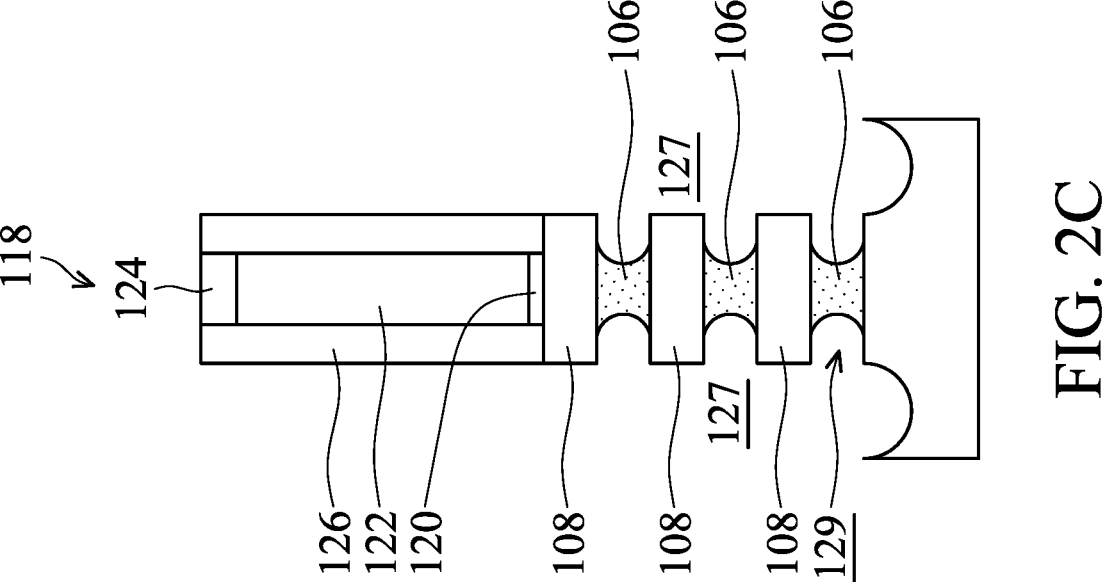

Afterwards, as shown in FIG. 2C, after the source/drain (S/D) recesses 127 are formed, the first semiconductor material layers 106 exposed by the source/drain (S/D) recesses 127 are laterally recessed to form notches 129, in accordance with some embodiments.

In some embodiments, an etching process is performed on the semiconductor structure 100a to laterally recess the first semiconductor material layers 106 of the fin structure 104 from the source/drain recesses 127. In some embodiments, during the etching process, the first semiconductor material layers 106 have a greater etching rate (or etching amount) than the second semiconductor material layers 108, thereby forming notches 129 between adjacent second semiconductor material layers 108. In some embodiments, the etching process is an isotropic etching such as dry chemical etching, remote plasma etching, wet chemical etching, another suitable technique, and/or a combination thereof.

Next, as shown in FIG. 2D, after the etching process, an oxide layer 130 is formed in the notches 129, in accordance with some embodiments. The oxide layer 130 is a native oxide layer. The semiconductor structure 100a is expose to atmosphere (e.g., with breaking vacuum) after the etching process, and the native oxide layer 130 is formed in the notches 129. In some embodiments, the first semiconductor material layers 106 are made of SiGe, and the oxide layer 130 is made of SiGeOx.

Figure 2E:
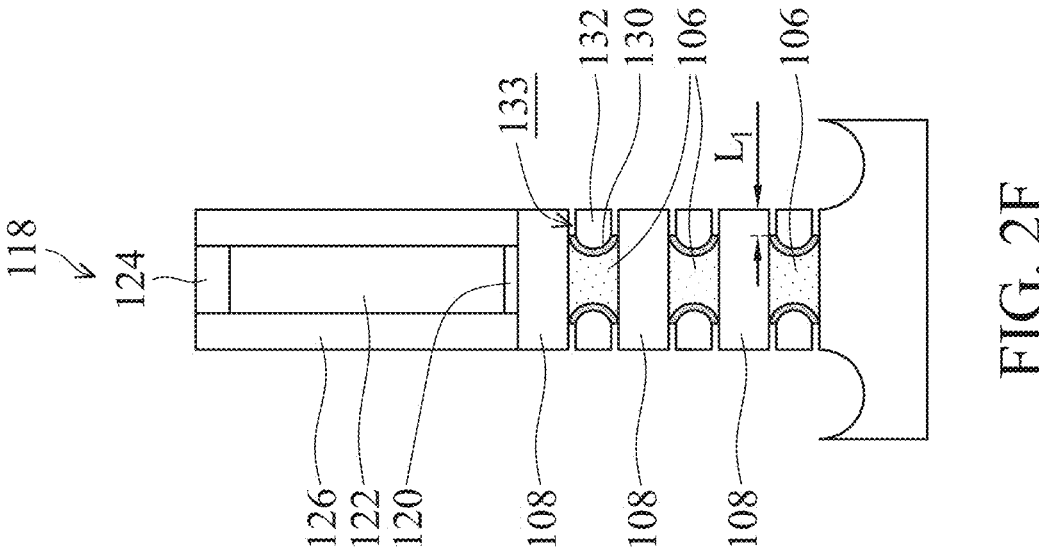

Next, as shown in FIG. 2E, inner spacer layers 132 are formed in the notches 129 between the second semiconductor material layers 108, in accordance with some embodiments. In addition, the inner spacer layers 132 are formed on the oxide layer 130. The oxide layer 130 is between the inner spacer layers 132 and the second semiconductor material layers 108.

The inner spacer layers 132 are configured to separate the source/drain structures and the gate structure formed in subsequent manufacturing processes in accordance with some embodiments.

In some embodiments, the inner spacer layers 132 are made of a dielectric material, such as silicon oxide ($SiO_2$), silicon nitride (SiN), silicon carbide (SIC), silicon oxynitride (SiON), silicon carbon nitride (SiCN), silicon oxide carbonitride (SiOCN), or a combination thereof. In some embodiments, the inner spacer layer 132 is formed by a deposition process, such as chemical vapor deposition (CVD) process, atomic layer deposition (ALD) process, another applicable process, or a combination thereof.

Figure 2F:
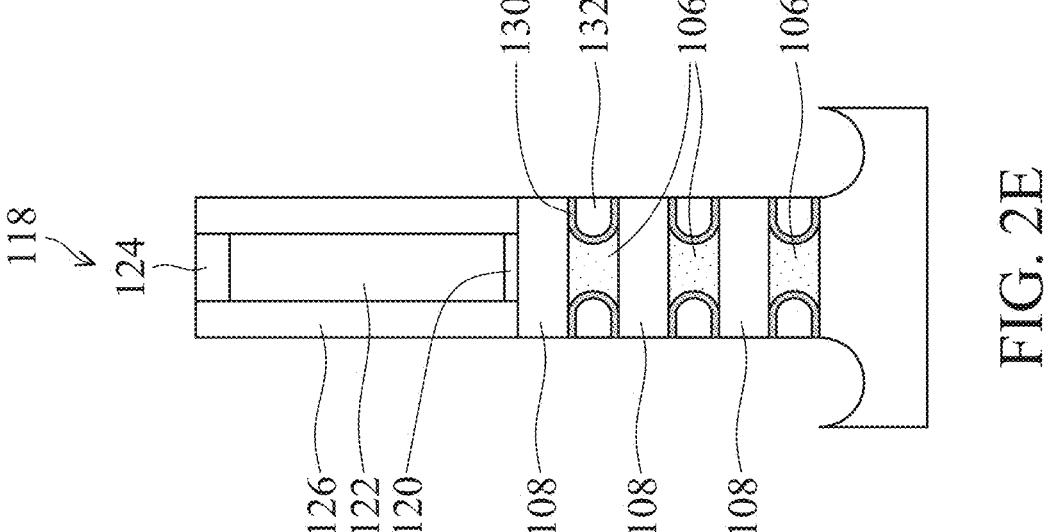

Afterwards, as shown in FIG. 2F, an etching process is performed to remove a portion of the oxide layer 130 to form a cavity 133, in accordance with some embodiments. After the etching process, an anneal process is performed. The anneal process is configured to remove the unwanted products generated from the etching process. The cavity 133 is surrounded by the inner spacer layer 132 and second semiconductor layers 108.

In some embodiments, the etching process is a dry etching. In some embodiments, the etching process is performed by using the etchant comprising HF, $NH_3$, HCl, $NF_3$, $H_2$, or applicable materials. In some embodiments, the anneal process is performed on a temperature in a range from about 90 degrees Celsius to about 200 degrees Celsius. When the temperature of the anneal process is in above-mentioned range, the unwanted products can be removed efficiently.

In some embodiments, a portion of the oxide layer 130 is removed to form the cavity. In some other embodiments, an entirety of the oxide layer 130 is removed. The cavity 133 has a length $L_1$ along the horizontal direction. In some embodiments, the length $L_1$ of the cavity 133 is in a range from about 0.5 nm to about 7 nm.

Figure 2G:
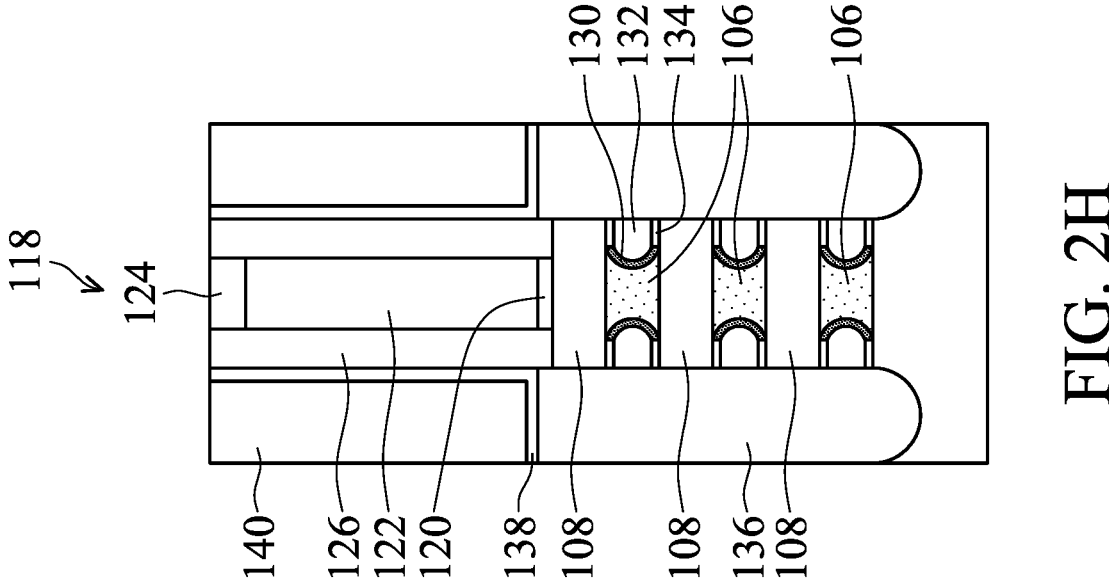

Afterwards, as shown in FIG. 2G, after the etching process, a barrier layer 134 is formed in the cavity 133, and the source/drain (S/D) structures 136 are formed in the S/D recesses 127 after the barrier layer 134 is formed, in accordance with some embodiments. The S/D structures 136 are formed on and in direct contact with the barrier layer 134.

The barrier layer 134 is configured to use as a stop layer to prevent the dopant of the S/D structures 136 diffusing into the nanostructures 108' (formed later, in FIG. 2I) to improve the gate control. In addition, the barrier layer 134 with dopant can reduce the parasitic resistance and retard the etching rate during the nanostructures 108' (formed later, in FIG. 2I) formation.

Furthermore, the barrier layer 134 with respect to the first semiconductor layers 106 has high etching selectively. Therefore, when the first semiconductor layers 106 are removed by the etching process in FIG. 2I (nanostructures 108' formation step), the barrier layer 134 is not removed. In some embodiments, the barrier layer 134 can be part of the nanostructures (or channel layer).

In some embodiments, the barrier layer 134 includes silicon (Si), silicon germanium (SiGe), doped silicon, doped silicon germanium (SiGe), or another applicable material. In some embodiments, the barrier layer 134 is doped to form the doped barrier layer 134. The doped barrier layer 134 includes boron (B) doped silicon (Si), SiAs, SiP or another applicable material. In some embodiments, the doping concentration of the dopant of the barrier layer 134 is in a range from about 1E20 cm-3 to about 5E21 cm-3. In some embodiments, the barrier layer 134 includes silicon (Si), and the S/D structures 136 include silicon germanium (SiGe). In some embodiments, the barrier layer 134 includes silicon germanium (SiGe), the S/D structures 136 include silicon germanium (SiGe), and the germanium concentration of the barrier layer 134 is smaller than the germanium concentration of the S/D structures 136. In some embodiments, the germanium concentration of the barrier layer 134 is in a range from about 1% to about 10%, and the germanium concentration of the S/D structures 136 is in a range from about 11% to about 70%.

In some embodiments, the barrier layer 134 is free from germanium (Ge) atom. In some embodiments, the barrier layer 134 is free from oxygen (O) atom. In some embodiments, the barrier layer 134 has a thickness in a range from about 0.2 to about 3 nm.

In some embodiments, the barrier layer 134 is formed by chemical vapor deposition (CVD) process, furnace process, atomic layer deposition (ALD) process, or another applicable process. In some embodiments, the barrier layer 134 is formed in the cavity 133 and selectively formed on the epitaxial region. Therefore, the barrier layer 134 is formed on the first semiconductor layers 106 and the second semiconductor layers 108.

In some embodiments, the barrier layer 134 is formed on the inner spacer layers 132, and the etching process is performed to remove the portion of the barrier layer 134 which is formed on the inner spacer layers 132. As a result, the barrier layer 134 can be "selectively" formed on certain regions. It should be noted that the inner spacer layer 132 is made of amorphous material, not epitaxial material, and the adhesion between the barrier layer 134 and the inner spacer layers 132 is poor, and therefore the portion of the barrier layer 134 which is formed on the inner spacer layers 132 can be removed easily by the etching process.

In some embodiments, the S/D structures 136 are made of any applicable material, such as Ge, Si, GaAs, AlGaAs, SiGe, GaAsP, SiP, SiC, SiCP, or a combination thereof. In some embodiments, the S/D structures 136 are formed using an epitaxial growth process, such as Molecular beam epitaxy (MBE), Metal-organic Chemical Vapor Deposition (MOCVD), Vapor-Phase Epitaxy (VPE), another applicable epitaxial growth process, or a combination thereof.

In some embodiments, the S/D structures 136 are in-situ doped during the epitaxial growth process. For example, the S/D structures 136 may be the epitaxially grown SiGe doped with boron (B). For example, the S/D structures 136 may be the epitaxially grown Si doped with carbon to form silicon: carbon (Si: C) source/drain features, phosphorous to form silicon: phosphor (Si: P) source/drain features, or both carbon and phosphorous to form silicon carbon phosphor (SiCP) source/drain features. In some embodiments, the S/D structures 136 are doped in one or more implantation processes after the epitaxial growth process.

Figure 2H:
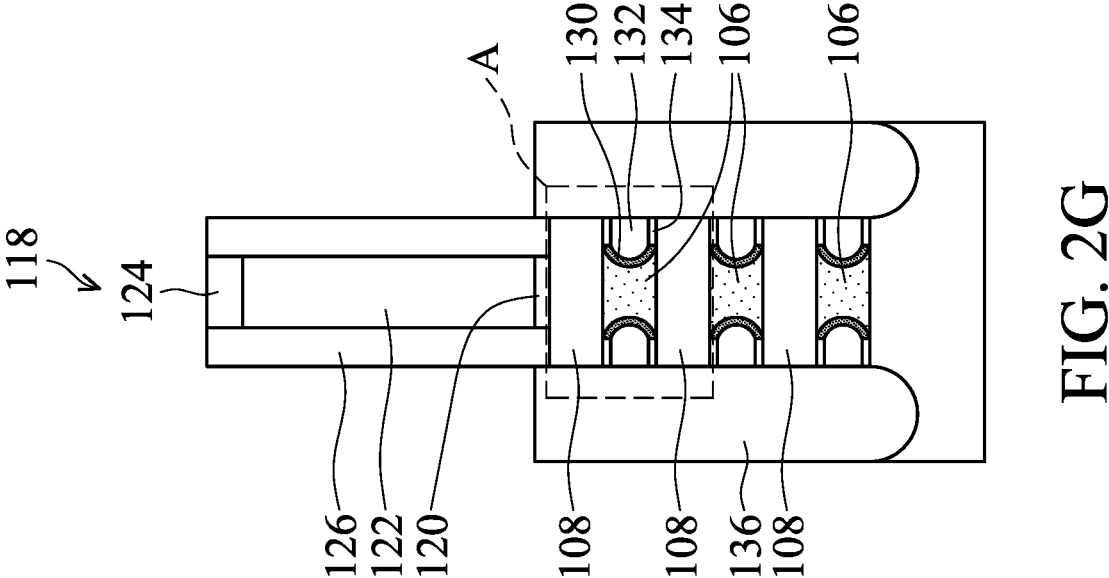

Next, as shown in FIG. 2H, after the S/D structures 136 are formed, a contact etch stop layer (CESL) 138 is conformally formed to cover the S/D structures 136 and an interlayer dielectric (ILD) layer 140 is formed over the contact etch stop layers 138, in accordance with some embodiments.

In some embodiments, the contact etch stop layer 138 is made of a dielectric material, such as silicon nitride, silicon oxide, silicon oxynitride, another suitable dielectric material, or a combination thereof. The dielectric material for the contact etch stop layers 138 may be conformally deposited over the semiconductor structure by performing chemical vapor deposition (CVD), ALD, another application method, or a combination thereof.

The ILD layer 140 may include multilayers made of multiple dielectric materials, such as silicon oxide, silicon nitride, silicon oxynitride, phosphosilicate glass (PSG), borophosphosilicate glass (BPSG), or another applicable low-k dielectric material. The ILD layer 140 may be formed by chemical vapor deposition (CVD), physical vapor deposition, (PVD), atomic layer deposition (ALD), or another applicable process.

After the contact etch stop layer 138 and the ILD layer 140 are deposited, a planarization process such as CMP or an etch-back process may be performed until the dummy gate electrode layer 122 of the dummy gate structure 118 are exposed, as shown in FIG. 2H in accordance with some embodiments.

Figure 2J:
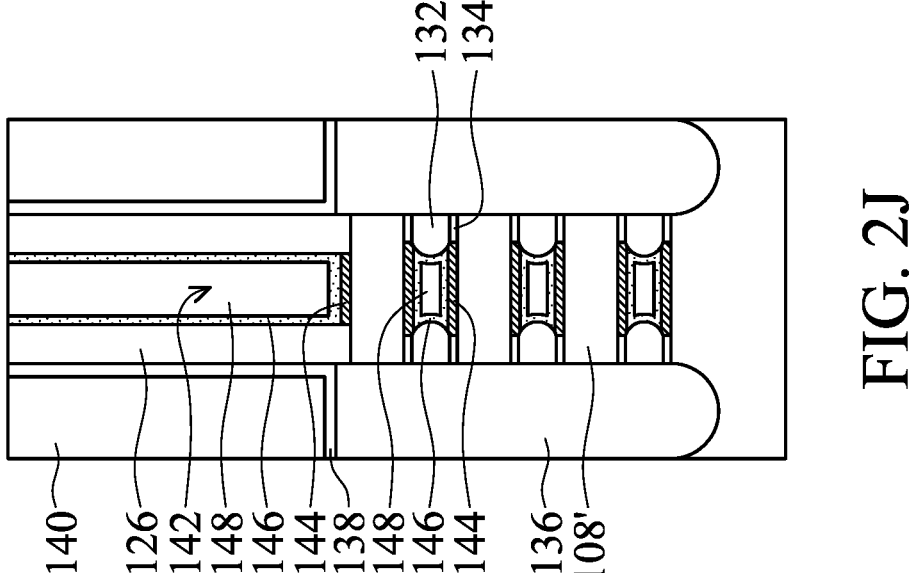
Figure 2I:
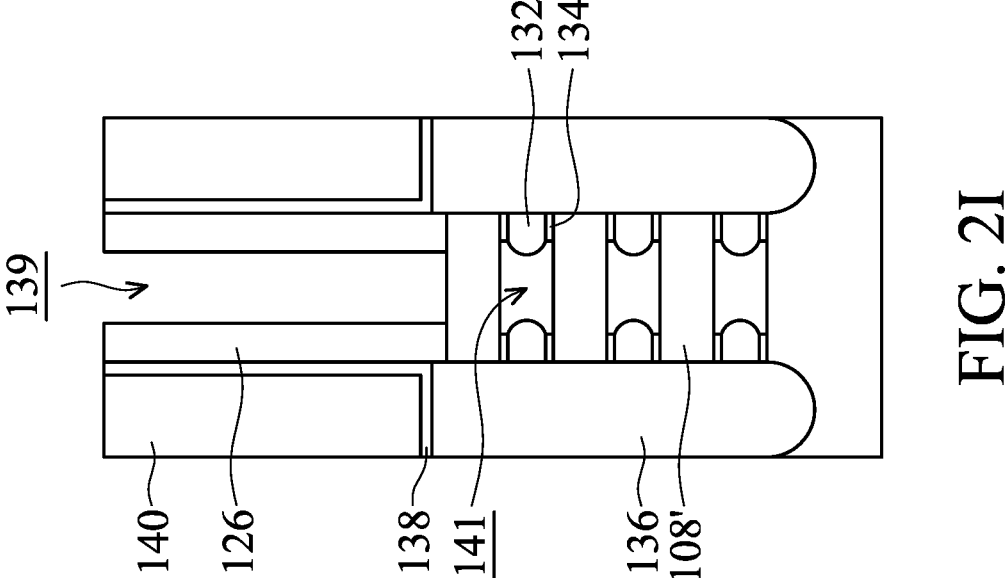

Afterwards, as shown in FIG. 2I, the dummy gate structure 118 are removed to form a trench 139, and the first semiconductor material layers 106 are removed to form gaps 141, in accordance with some embodiments. As a result, the nanostructures 108' (or the channel layers 108') with the second semiconductor material layers 108 are formed.

It should be noted that, in some embodiments, the oxide layer 130 shown in FIG. 2H is removed completely while the first semiconductor layers 106 are removed. In some embodiments, the first semiconductor layers 106 are made of silicon germanium (SiGe) and the oxide layer 130 is made of silicon germanium oxide (SiGeOx), and the oxide layer 130 and the first semiconductor layers 106 are removed at the same time.

In some other embodiments, the oxide layer 130 shown in FIG. 2H is not removed completely, and the remaining oxide layer 130 is formed between the gate structure 142 and the inner spacer layer 132.

The removal process may include one or more etching processes. For example, when the dummy gate electrode layer 122 is polysilicon, a wet etchant such as a tetramethylammonium hydroxide (TMAH) solution may be used to selectively remove the dummy gate electrode layer 122. Afterwards, the dummy gate dielectric layer 120 may be removed using a plasma dry etching, a dry chemical etching, and/or a wet etching. The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions. In some embodiments, the upper portions of the gate spacer layers 126 are also removed Afterwards, as shown in FIG. 2J, a gate structure 142 is formed in the trench 139 and the gaps 141, in accordance with some embodiments. More specifically, the dummy gate structure 118 and the first semiconductor material layers 106 are removed to form nanostructures 108' with the second semiconductor material layers 108, in accordance with some embodiments. The S/D structure 136 is attached to the nanostructures 108'.

After the nanostructures 108' are formed, the gate structures 142 are formed wrapped around the nanostructures 108' (or the channel layers 108'). The gate structures 142 wrap around the nanostructures 108' to form gate-all-around transistor structures in accordance with some embodiments. In some embodiments, the gate structure 142 includes an interfacial layer 144, a gate dielectric layer 146, and a gate electrode layer 148.

In some embodiments, the interfacial layers 144 are oxide layers formed around the nanostructures 108' and on the top of the base fin structure 104B. In some embodiments, the interfacial layers 144 are formed by performing a thermal process.

In some embodiments, the gate dielectric layers 146 are formed over the interfacial layers 144, so that the nanostructures 108' are surrounded (e.g. wrapped) by the gate dielectric layers 146. In addition, the gate dielectric layers 146 also cover the sidewalls of the gate spacer layers 126 and the inner spacer layers 132 in accordance with some embodiments. In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

In some embodiments, the gate electrode layers 148 are formed on the gate dielectric layer 146. In some embodiments, the gate electrode layers 148 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 148 are formed using chemical vapor deposition (CVD), atomic layer deposition (ALD), electroplating, another applicable method, or a combination thereof. Other conductive layers, such as work function metal layers, may also be formed in the gate structures 142, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

After the interfacial layers 144, the gate dielectric layers 146, and the gate electrode layers 148 are formed, a planarization process such as CMP or an etch-back process may be performed until the ILD layer 140 is exposed.

Figure 2K:
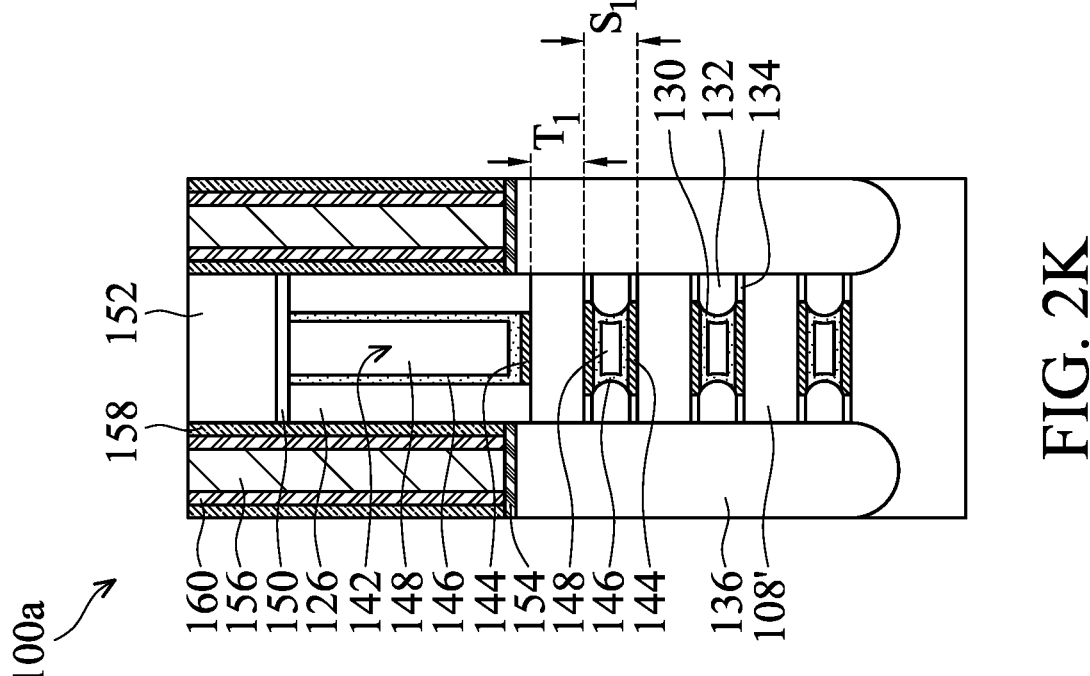

Afterwards, as shown in FIG. 2K, an etch stop layer 150 is formed over the gate structure 142, and a dielectric layer 152 is formed over the etch stop layer 150, in accordance with some embodiments. Next, S/D contact structures 156 are formed over the S/D structures 136.

In some embodiments, the contact openings may be formed through the contact etch stop layer 138, the interlayer dielectric layer 140, the etch stop layer 150 and the dielectric layer 152 to expose the top surfaces of the S/D structures 136, and the silicide layers 154 and the S/D contact structure 156 may be formed in the contact openings. The contact openings may be formed using a photolithography process and an etching process. In addition, some portions of the S/D structures 136 exposed by the contact openings may also be etched during the etching process.

After the contact openings are formed, the silicide layers 154 may be formed by forming a metal layer over the top surface of the S/D structures 136 and annealing the metal layer so the metal layer reacts with the S/D structures 136 to form the silicide layers 154. The unreacted metal layer may be removed after the silicide layers 154 are formed.

Afterwards, the liners 158, the barrier layers 160, and the S/D contact structure 156 are formed over the silicide layers 154 in the contact openings and a polishing process is performed. As shown in FIG. 2K, the top surface of the S/D contact structure 156 is substantially level with the top surface of the dielectric layer 152, in accordance with some embodiments.

In some embodiments, the etch stop layer 150 is made of a dielectric material, such as silicon nitride, silicon oxide, silicon oxynitride, another suitable dielectric material, or a combination thereof. The dielectric material for the etch stop layers 150 may be conformally deposited over the semiconductor structure by performing chemical vapor deposition (CVD), atomic layer deposition (ALD), another application method, or a combination thereof.

In some embodiments, the dielectric layer 152 may include multilayers made of multiple dielectric materials, such as silicon oxide, silicon nitride, silicon oxynitride, phosphosilicate glass (PSG), borophosphosilicate glass (BPSG), or another applicable low-k dielectric material. The dielectric layer 152 may be formed by chemical vapor deposition (CVD), physical vapor deposition, (PVD), atomic layer deposition (ALD), or another applicable process.

In some embodiments, the S/D contact structure 156 are made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), another applicable conductive material, or a combination thereof. In some embodiments, the liner 158 is made of silicon nitride, although any other applicable dielectric may be used as an alternative.

In some embodiments, the barrier layer 160 is made of tantalum nitride, although other materials, such as tantalum, titanium, titanium nitride, or the like, may also be used. The liners 158, the barrier layers 160, and the S/D contact structure 156 may be formed using a process such as chemical vapor deposition (CVD), physical vapor deposition (PVD), plasma enhanced CVD (PECVD), plasma enhanced physical vapor deposition (PEPVD), atomic layer deposition (ALD), or another applicable deposition process.

In some embodiments, the top surface of the S/D contact structure 156 is higher than the top surface of the gate structure 142 and is substantially level with the dielectric layer 152. In some embodiments, the height difference between the S/D contact structure 156 and the gate structure 142 is substantially level with the height of the dielectric layer 152.

If the oxide layer 130 (such as SiGeOx) is formed in the cavity 133 between the inner spacer layer 132 and the S/D structures 136, the dopant of the S/D structure 136 will diffuse into the nanostructures 108' (or channel layers), and the gate control of the semiconductor structure 100a will be degraded. In addition, if the oxygen (O) atoms of the oxide layer 130 (such as SiGeOx) are diffused into the nanostructures 108' (or channel layers), and mobility of the nanostructures 108' (or channel layers) will degrade. In order to prevent the unwanted diffusion issue, the cavity 133 is filled with the barrier layer 134, the barrier layer 134 acts as the stop layer to prevent the dopant of the S/D structure 136 from diffusing into the nanostructures 108' (or channel layers).

Furthermore, if the oxide layer 130 (such as SiGeOx) is formed in the cavity 133, the oxide layer 130 is easily removed along with the removal of the first semiconductor layers 106 during the nanostructures 108' formation process (shown in FIG. 2I). The removal of the oxide layer 130 will case the defects, and the etchant of the etching process for removing the first semiconductor layers 106 will damage the S/D structures 136 through the defects. In order to reduce or prevent the damage of the S/D structures 136, the oxide layer 130 is replaced with the barrier layer 134. The barrier layer 134 with respect to the first semiconductor layers 106 has higher etching selectivity, and the barrier layer 134 is not removed while the nanostructures 108' formation process (shown in FIG. 2I)

By forming the barrier layer 134 between the inner spacer layer 132 and the S/D structures 136, the diffusion issue of the dopant of S/D structure 136 is reduced to improve the gate control. In addition, the S/D structures 136 is not damaged since the barrier layer 134 with respect to the first semiconductor layers 106 has high etching selectivity after the nanostructures 108' formation process (shown in FIG. 2I). Therefore, the performance of the semiconductor structure 100a is improved.

In some embodiments, one of the nanostructures 108' has a first thickness Ti in a vertical direction. In some embodiments, the first thickness Ti is in a range from about 3 nm to about 8 nm. In some embodiments, a first space Si between two adjacent nanostructures 108' is in a rage from about 3 nm to about 12 nm.

Figure 3:
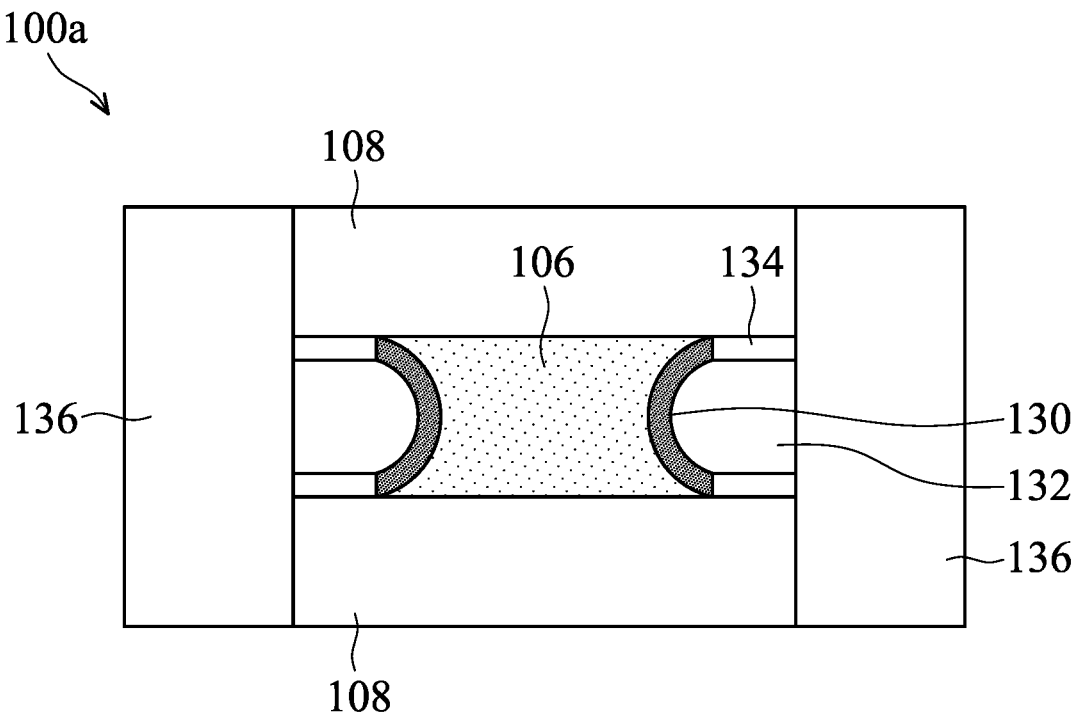
FIG. 3 illustrates an enlarged cross-sectional view of a region A of the semiconductor structure shown in FIG. 2G, in accordance with some embodiments.

FIG. 3 illustrates an enlarged cross-sectional view of a region A of the semiconductor structure 100a shown in FIG. 2G, in accordance with some embodiments.

As shown in FIG. 3, the barrier layer 134 is between the inner spacer layer 132 and the nanostructures 108'. In addition, the barrier layer 134 is in direct contact with the nanostructures 108' and the S/D structure 136. Furthermore, the sidewall surface of the barrier layer 134 is aligned with the sidewall surface of the inner spacer layer 132. The barrier layer 134 is directly below the gate spacer layer 126.

Figure 4:
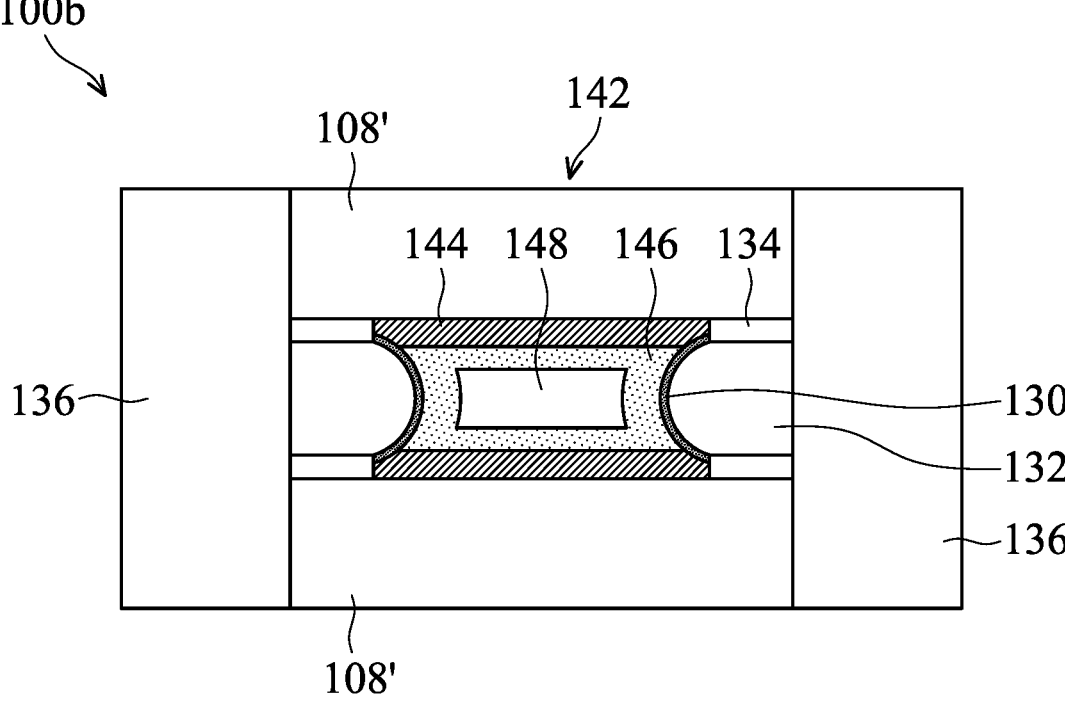
FIG. 4 illustrates an enlarged cross-sectional view of the region A of a semiconductor structure, in accordance with some embodiments.

FIG. 4 illustrates an enlarged cross-sectional view of the region A of a semiconductor structure 100b, in accordance with some embodiments. The semiconductor structure 100b of FIG. 4 includes elements that are similar to, or the same as, elements of the semiconductor structure 100a of FIG. 2J. The difference between FIG. 4 and FIG. 2J is that the remaining oxide layer 130 is formed between the gate structure 142 and the inner spacer layer 132. More specifically, the oxide layer 130 is not completely removed during removal of the first semiconductor layers 106. The remaining oxide layer 130 is in direct contact with the interfacial layer 144 and the gate dielectric layer 146 of the gate structure 142. The thickness of the remaining oxide layer 130 after the nanostructures 108' are formed in FIG. 2I is smaller than the oxide layer 130 in FIG. 2H.

Figure 5:
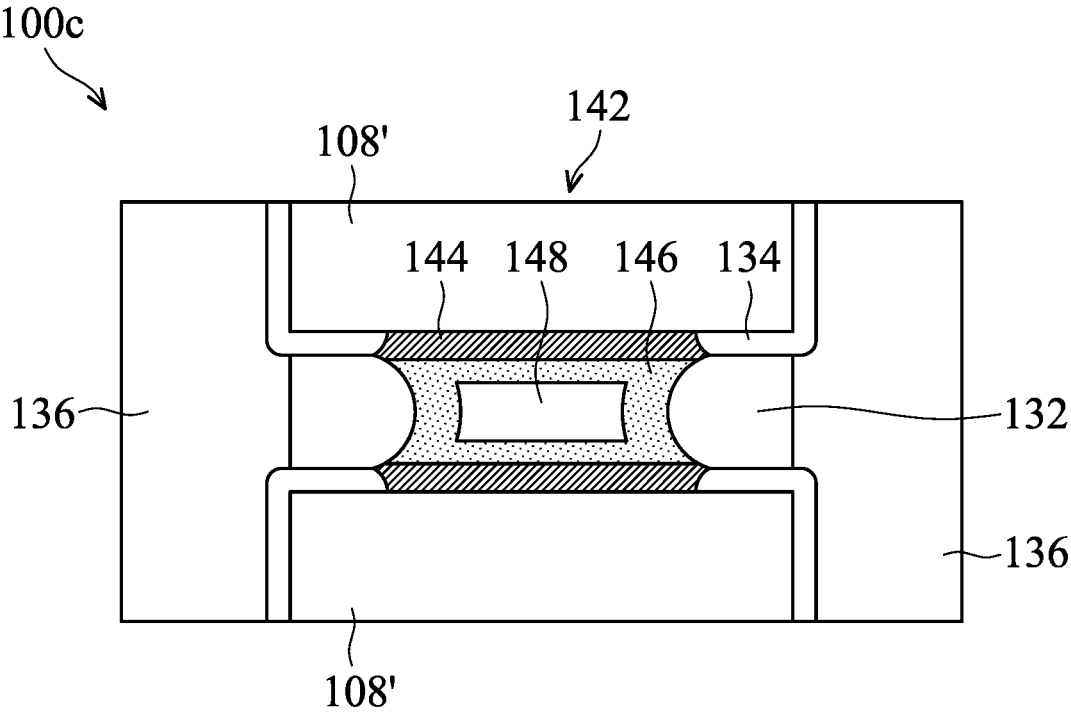
FIG. 5 illustrates an enlarged cross-sectional view of the region A of a semiconductor structure, in accordance with some embodiments.

FIG. 5 illustrates an enlarged cross-sectional view of the region A of a semiconductor structure 100c, in accordance with some embodiments. The semiconductor structure 100c of FIG. 5 includes elements that are similar to, or the same as, elements of the semiconductor structure 100a of FIG. 2J.

The difference between FIG. 5 and FIG. 2J is that the barrier layer 134 is formed on outer sidewall surfaces of the nanostructures 108'.

The barrier layer 134 is in direct contact with the sidewall surface of the nanostructures 108' facing the S/D structures 136. More specifically, the barrier layer 134 extends from a first position to a second position, and the first position is between the inner spacer layers 132 and the nanostructures 108', and the second position is between the nanostructures 108' and the S/D structures 136. The barrier layer 134 may have several separated portions, which are separated by the inner spacer layers 132.

Figure 6:
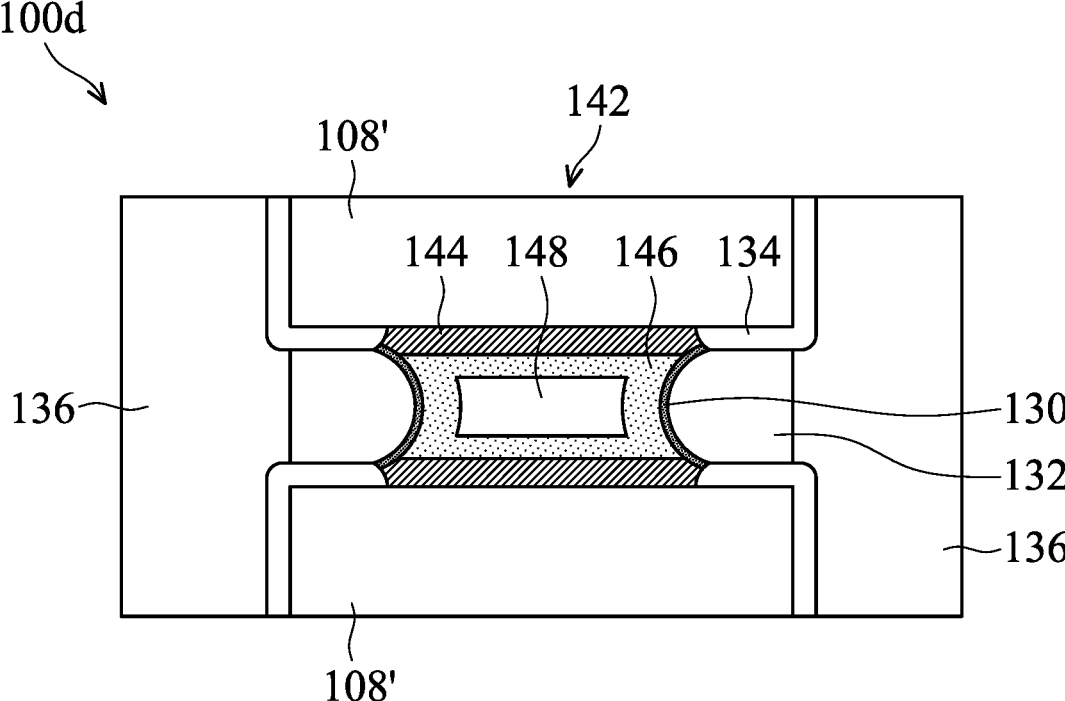
FIG. 6 illustrates an enlarged cross-sectional view of the region A of a semiconductor structure, in accordance with some embodiments.

FIG. 6 illustrates an enlarged cross-sectional view of the region A of a semiconductor structure 100d, in accordance with some embodiments. The semiconductor structure 100d of FIG. 6 includes elements that are similar to, or the same as, elements of the semiconductor structure 100c of FIG. 5. The difference between FIG. 6 and FIG. 5 is that the remaining oxide layer 130 is formed between the gate structure 142 and the inner spacer layer 132. The remaining oxide layer 130 is in direct contact with the interfacial layer 144 and the gate dielectric layer 146 of the gate structure 142.

Figure 7:
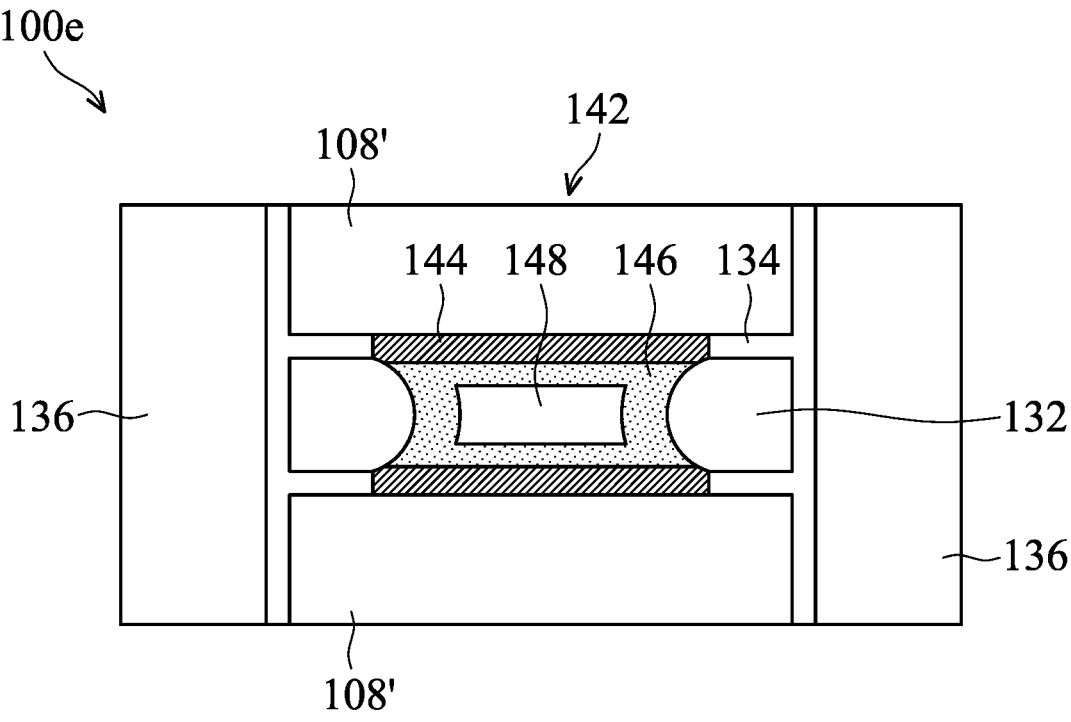
FIG. 7 illustrates an enlarged cross-sectional view of the region A of a semiconductor structure, in accordance with some embodiments.

FIG. 7 illustrates an enlarged cross-sectional view of the region A of a semiconductor structure 100e, in accordance with some embodiments. The semiconductor structure 100e of FIG. 7 includes elements that are similar to, or the same as, elements of the semiconductor structure 100a of FIG. 2J. The difference between FIG. 7 and FIG. 2J is that that the barrier layer 134 is formed on the outer sidewall surfaces of the nanostructures 108' and on the outer sidewall surface of the inner spacer layer 132.

The inner spacer layer 132 has a first surface facing the gate structure 142 and a second surface facing the S/D structure 136. The barrier layer 134 is in direct contact with the second surface of the inner spacer layer 132. In other words, the barrier layer 134 is between the inner spacer layer 132 and the S/D structure 136. The barrier layer 134 is a continuous layer which extends along the vertical direction.

Figure 8:
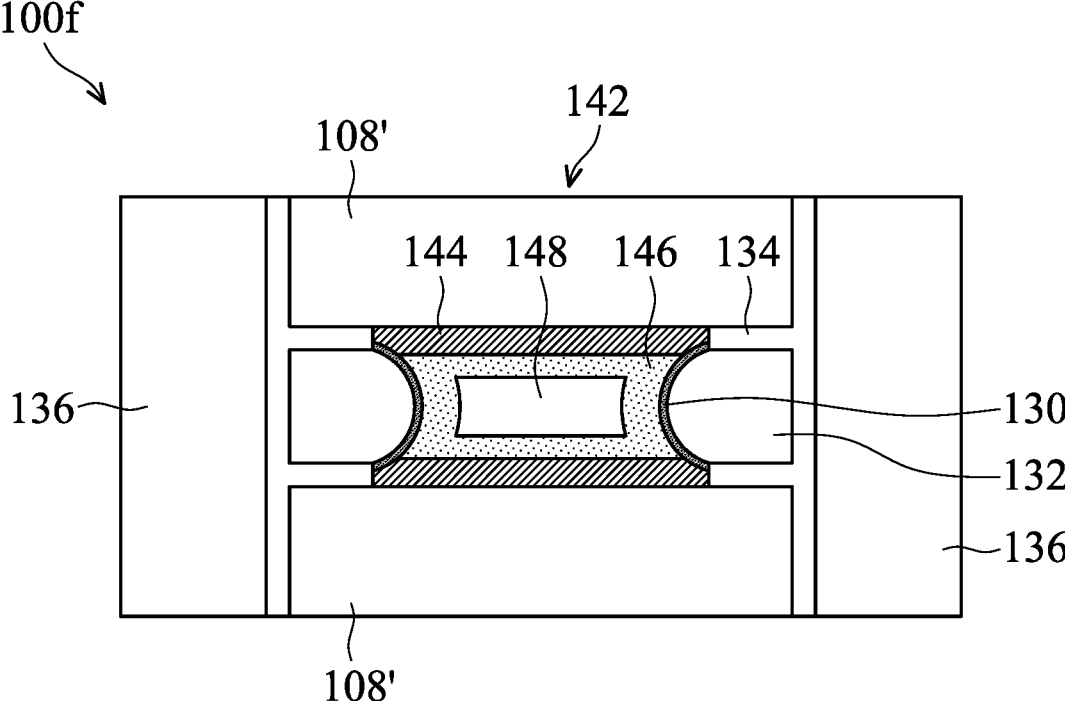
FIG. 8 illustrates an enlarged cross-sectional view of the region A of a semiconductor structure, in accordance with some embodiments.

FIG. 8 illustrates an enlarged cross-sectional view of the region A of a semiconductor structure 100f, in accordance with some embodiments. The semiconductor structure 100f of FIG. 8 includes elements that are similar to, or the same as, elements of the semiconductor structure 100e of FIG. 7. The difference between FIG. 8 and FIG. 7 is that the remaining oxide layer 130 is formed between the gate structure 142 and the inner spacer layer 132. The remaining oxide layer 130 is in direct contact with the interfacial layer 144 and the gate dielectric layer 146 of the gate structure 142.

Figure 9:
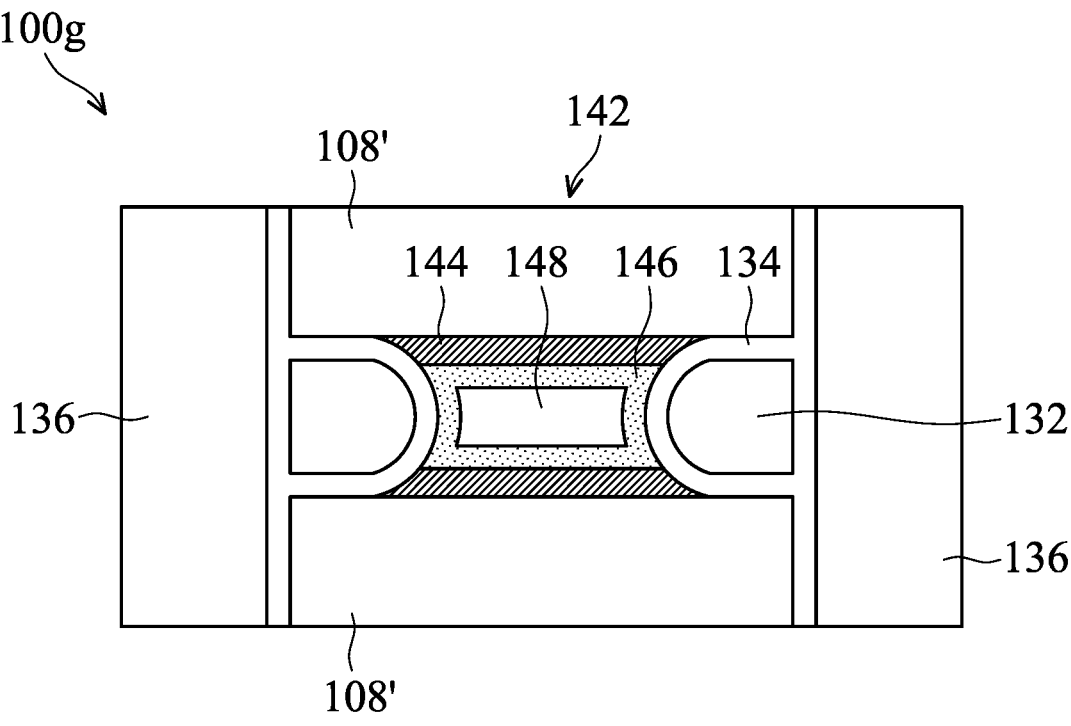
FIG. 9 illustrates an enlarged cross-sectional view of the region A of a semiconductor structure, in accordance with some embodiments.

FIG. 9 illustrates an enlarged cross-sectional view of the region A of a semiconductor structure 100g, in accordance with some embodiments. The semiconductor structure 100g of FIG. 9 includes elements that are similar to, or the same as, elements of the semiconductor structure 100a of FIG. 2J. The difference between FIG. 9 and FIG. 2J is that the top surface, the bottom surface and sidewall surfaces of the inner spacer layer 132 are surrounded by the barrier layer 134. The inner spacer layer 132 has a first surface facing the gate structure 142 and a second surface facing the S/D structure 136. The barrier layer 134 is in direct contact with the first surface and the second surface of the inner spacer layer 132. In other words, the inner spacer layer 132 has a curved surface that protrudes towards the gate structure 142, and the barrier layer 134 is formed on the curved surface of the inner spacer layer 132.

Figure 10:
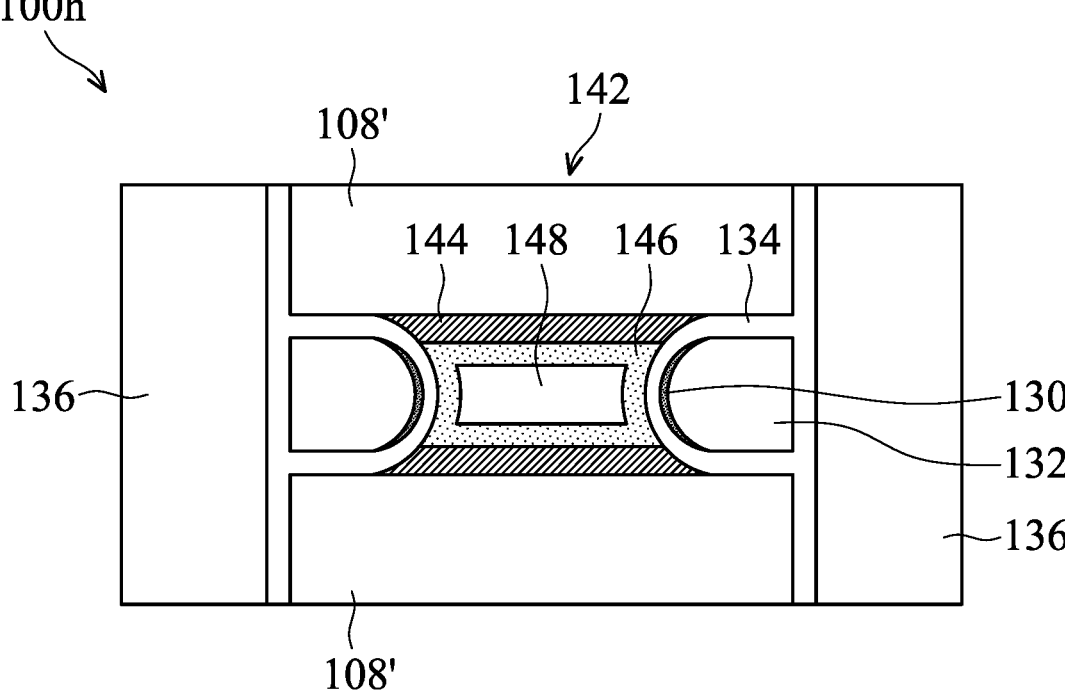
FIG. 10 illustrates an enlarged cross-sectional view of the region A of a semiconductor structure, in accordance with some embodiments.

FIG. 10 illustrates an enlarged cross-sectional view of the region A of a semiconductor structure 100h, in accordance with some embodiments. The semiconductor structure 100h of FIG. 10 includes elements that are similar to, or the same as, elements of the semiconductor structure 100g of FIG. 9. The difference between FIG. 10 and FIG. 9 is that the remaining oxide layer 130 is formed between the gate structure 142 and the inner spacer layer 132. The remaining oxide layer 130 is in direct contact with the interfacial layer 144 and the gate dielectric layer 146 of the gate structure 142.

The barrier layer 134 plays many roles. The barrier layer 134 can be a stop layer to prevent or reduce the diffusion of the dopant of the S/D structures 136 and protect the S/D structures 136 from being damaged. The barrier layer 134 can be part of the nanostructures (or the channel layer).

In some embodiments, the barrier layer 134 is formed between the inner spacer layers 132 and the nanostructures 108'. In some embodiments, the barrier layer 134 is formed between the inner spacer layers 132 and the S/D structures 136.

The barrier layer 134 is in direct contact with the sidewall surface of the nanostructures 108' facing the S/D structures 136. More specifically, the barrier layer 134 extends from the first position to the second position, and the first position is between the inner spacer layers 132 and the nanostructures 108', and the second position is between the nanostructures 108' and the S/D structures 136. The barrier layer 134 may have several separated portions as shown in FIGS. 5 and 6 which are separated by the inner spacer layers 132.

The inner spacer layer 132 has a first surface facing the gate structure 142 and a second surface facing the S/D structure 136. The barrier layer 134 is in direct contact with the second surface of the inner spacer layer 132. In other words, the barrier layer 134 is between the inner spacer layer 132 and the S/D structure 136. The barrier layer 134 is a continuous layer as shown in FIGS. 7 and 8 which extends along the vertical direction.

It should be noted that, in some embodiments, the oxide layer 130 shown in FIG. 2H is removed completely while the first semiconductor layers 106 are removed. In some embodiments, the first semiconductor layers 106 are made of silicon germanium (SiGe) and the oxide layer 130 is made of silicon germanium oxide (SiGeOx), and the oxide layer 130 and the first semiconductor layers 106 are removed at the same time. In some other embodiments, the oxide layer 130 shown in FIG. 2H is not removed completely, and the remaining oxide layer 130 is formed between the gate structure 142 and the inner spacer layer 132.

It should be noted that same elements in FIGS. 1A to 10 may be designated by the same numerals and may include similar or the same materials and may be formed by similar or the same processes; therefore such redundant details are omitted in the interest of brevity. In addition, although FIGS. 1A to 10 are described in relation to the method, it will be appreciated that the structures disclosed in FIGS. 1A to 10 are not limited to the method but may stand alone as structures independent of the method. Similarly, although the methods shown in FIGS. 1A to 10 are not limited to the disclosed structures but may stand alone independent of the structures. Furthermore, the nanostructures described above may include nanowires, nanosheets, and other applicable nanostructures, in accordance with some embodiments.

Also, while disclosed methods are illustrated and described above as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The nanostructures are formed on a substrate, and a gate structure wraps around the nanostructures. An S/D structure adjacent to the gate structure, and an inner spacer layer between the gate structure and the S/D structure. An native oxide layer is formed before forming the inner spacer layer, and a portion of the native oxide layer is removed to form the cavity. Next, the barrier layer is formed in the cavity to use as a stop layer. The barrier layer is used to prevent or reduce the diffusion of the dopant of the S/D structure and prevent the damage of the S/D structure. In addition, the barrier layer can be part of the nanostructures (or channel layer). Since the unwanted diffusion issue and the damage of the S/D structures are reduced, the gate control of the semiconductor structure is improved. Therefore, the performance of the semiconductor structure may be improved.

In some embodiments, a semiconductor structure is provided. The semiconductor structure includes a plurality of nanostructures formed over a substrate, and a gate structure formed on the nanostructures. The semiconductor structure includes a source/drain (S/D) structure formed adjacent to the gate structure, and an inner spacer layer between the gate structure and the S/D structure. The semiconductor structure includes a barrier layer adjacent to the inner spacer layer, and the barrier layer is between the inner spacer layer and the nanostructures.

In some embodiments, a semiconductor structure is provided. The semiconductor structure includes a plurality of nanostructures formed over a substrate, and an inner spacer layer between two adjacent nanostructures. The semiconductor structure includes a source/drain (S/D) structure formed adjacent to the inner spacer layer, and a barrier layer adjacent to the inner spacer layer. The barrier layer extends from the first position to the second position, the first position is between the inner spacer layer and the nanostructure, and the second position is between the nanostructures and the S/D structure.

In some embodiments, a method for forming a semiconductor structure is provided. The method includes forming a plurality of first semiconductor layers and a plurality of second semiconductor layers on a substrate, and the first semiconductor layers and the second semiconductor layers are alternately stacked. The method also includes forming a dummy gate structure over the first semiconductor layers and the second semiconductor layers, and removing a portion of the first semiconductor layers and a portion of second semiconductor layers to form a recess. The method includes removing another portion of the second semiconductor layers to form a notch between two adjacent first semiconductor layers, and an oxide layer is formed after the formation of the notch. The method includes forming an inner spacer layer in the notch, and removing a portion of the oxide layer to form a cavity. The method includes forming a barrier layer in the cavity, and the barrier layer is between the inner spacer and the first semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a plurality of nanostructures formed over a substrate;
a gate structure formed on the nanostructures;
a source/drain (S/D) structure formed adjacent to the gate structure;
an inner spacer layer between the gate structure and the S/D structure; and
a barrier layer adjacent to the inner spacer layer, wherein the barrier layer is between the inner spacer layer and the nanostructures, wherein the inner spacer layer has a first surface away from the S/D structure and a second surface facing the S/D structure, the second surface is aligned with an outer sidewall surface of the barrier layer.

2. The semiconductor structure as claimed in claim 1, wherein the barrier layer is in direct contact with the nanostructures and the S/D structure.

3. The semiconductor structure as claimed in claim 1, wherein the barrier layer is formed on an outer sidewall surface of the nanostructures.

4. The semiconductor structure as claimed in claim 1, wherein the barrier layer is between the inner spacer layer and the S/D structure.

5. The semiconductor structure as claimed in claim 1, wherein the inner spacer layer has a curved surface that protrudes toward the gate structure.

6. The semiconductor structure as claimed in claim 5, wherein the barrier layer is formed on the curved surface of the inner spacer layer.

7. The semiconductor structure as claimed in claim 1, further comprising:
an oxide layer between the gate structure and the inner spacer layer.

8. The semiconductor structure as claimed in claim 1, further comprising:
a gate spacer layer formed on a sidewall surface of the gate structure, wherein the barrier layer is directly below the gate spacer layer.

9. A semiconductor structure, comprising:
a plurality of nanostructures formed over a substrate;
an inner spacer layer between two adjacent nanostructures;
a source/drain (S/D) structure formed adjacent to the inner spacer layer; and
a barrier layer adjacent to the inner spacer layer, wherein the barrier layer comprises a first portion and a second portion, the first portion is between the inner spacer layer and the nanostructures, and the second portion is between the nanostructures and the S/D structure, wherein the first portion of the barrier layer is orthogonal to the second portion of the barrier layer.

10. The semiconductor structure as claimed in claim 9, wherein the barrier layer is in direct contact with a sidewall surface of the nanostructures facing the S/D structure.

11. The semiconductor structure as claimed in claim 9, wherein the inner spacer layer has a first surface away from the S/D structure and a second surface facing the S/D structure, and the barrier layer is in direct contact with the second surface.

12. The semiconductor structure as claimed in claim 11, wherein the barrier layer is in direct contact with the first surface and the second surface.

13. The semiconductor structure as claimed in claim 9, further comprising:
a gate structure between two adjacent nanostructures, and
an oxide layer between the gate structure and the S/D structure.

14. The semiconductor structure as claimed in claim 9, further comprising:
a gate structure between two adjacent nanostructures, wherein the gate structure comprises an interfacial layer, a gate dielectric layer and a gate electrode layer;
an oxide layer between the gate structure and the inner spacer layer, wherein the oxide layer interfaces the interfacial layer and the gate dielectric layer.

15. A method for forming a semiconductor structure, comprising:
forming a plurality of first semiconductor layers and a plurality of second semiconductor layers on a substrate, wherein the first semiconductor layers and the second semiconductor layers are alternately stacked;
forming a dummy gate structure over the first semiconductor layers and the second semiconductor layers;
removing a portion of the first semiconductor layers and a portion of second semiconductor layers to form a recess;
removing another portion of the second semiconductor layers to form a notch between two adjacent first semiconductor layers, wherein an oxide layer is formed after the notch is formed;
forming an inner spacer layer in the notch;
removing a portion of the oxide layer to form a cavity; and
forming a barrier layer in the cavity, wherein the barrier layer is between the inner spacer layer and the first semiconductor layers.

16. The method for forming the semiconductor structure as claimed in claim 15, further comprising:
forming an S/D structure in the recess, wherein the S/D structure is in direct contact with the barrier layer.

17. The method for forming the semiconductor structure as claimed in claim 15, further comprising:
forming a gate spacer layer adjacent to the dummy gate structure, wherein the barrier layer is directly below the gate spacer layer.

18. The method for forming the semiconductor structure as claimed in claim 15, further comprising:
removing the dummy gate structure;
removing a remaining second semiconductor layers to form a gap; and
forming a gate structure in the gap, wherein the barrier layer is in direct contact with the gate structure.

19. The method for forming the semiconductor structure as claimed in claim 18, further comprising:
removing a remaining second semiconductor layers and simultaneously removing a remaining oxide layer.

20. The method for forming the semiconductor structure as claimed in claim 15, further comprising:

doping the barrier layer to form a doped barrier layer.

* * * * *